United States Patent [19]

Strugach et al.

[11] Patent Number: 5,780,958
[45] Date of Patent: Jul. 14, 1998

[54] PIEZOELECTRIC VIBRATING DEVICE

[75] Inventors: Michael G. Strugach, Calabasas; Andrei Szilagyi, Rancho Palos Verdes, both of Calif.

[73] Assignee: Aura Systems, Inc., El Segundo, Calif.

[21] Appl. No.: 552,370

[22] Filed: Nov. 3, 1995

[51] Int. Cl.⁶ .................... H01L 41/08; B06B 1/06
[52] U.S. Cl. .................... 310/348; 310/330; 310/349
[58] Field of Search .................... 310/317, 324, 310/330, 331, 369, 345, 348, 349, 353, 354

[56] References Cited

U.S. PATENT DOCUMENTS

| | | | |
|---|---|---|---|
| 3,868,954 | 3/1975 | Ueda | 128/2.055 |
| 4,193,647 | 3/1980 | Guess et al. | 310/324 |
| 4,344,743 | 8/1982 | Bessman et al. | 417/317 |
| 4,352,961 | 10/1982 | Kumada et al. | 179/110 |
| 4,464,598 | 8/1984 | Besson et al. | 310/344 |
| 4,685,767 | 8/1987 | Ueshiba et al. | 350/255 |
| 4,779,246 | 10/1988 | Dietzsch et al. | 367/157 |
| 4,872,335 | 10/1989 | Tsuruoka et al. | 73/30 |
| 4,965,483 | 10/1990 | Abe et al. | 310/324 |
| 4,969,197 | 11/1990 | Takaya | 381/190 |
| 4,992,693 | 2/1991 | Kishi et al. | 310/348 |
| 5,023,504 | 6/1991 | Mooney et al. | 310/322 |
| 5,053,671 | 10/1991 | Kobayashi et al. | 310/329 |
| 5,079,472 | 1/1992 | Uhl et al. | 310/332 |
| 5,107,540 | 4/1992 | Mooney et al. | 381/192 |
| 5,181,019 | 1/1993 | Gottlieb et al. | 340/474 |
| 5,229,744 | 7/1993 | Ogura | 340/311.1 |
| 5,354,032 | 10/1994 | Sims et al. | 251/129.06 |
| 5,471,721 | 12/1995 | Harding | 29/25.35 |

Primary Examiner—Thomas M. Dougherty
Attorney, Agent, or Firm—Kathy Mojibi Kavcioglu

[57] ABSTRACT

A piezoelectric vibrating device is disclosed. The device includes a case having a first compartment with a first compartment height. A bender element, fabricated from an piezoelectric material, is disposed within the first compartment. A motion limiter is disposed within the case for preventing damage to the bender. The motion limiter has a first portion that abuts against the case to prevent the first compartment height from compressing beyond a predetermined first compartment minimal height. The device further includes electronic controls for providing a signal to the bender element. The electronic controls further include an optimal wave form signal generator. The wave form may also be a square wave, pulse train, truncated wave or other type of wave depending on each particular application.

2 Claims, 3 Drawing Sheets

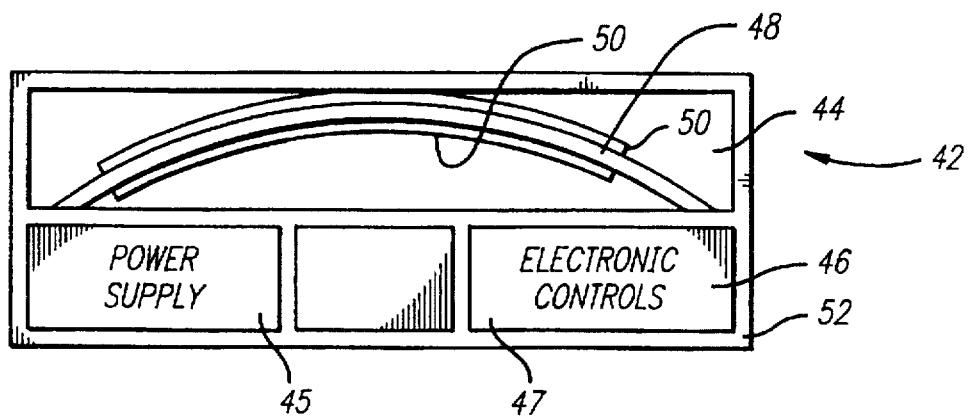
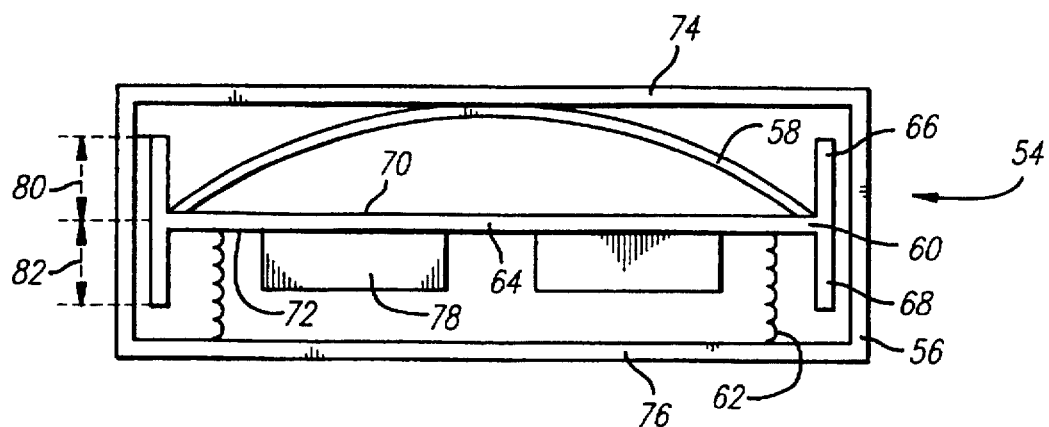
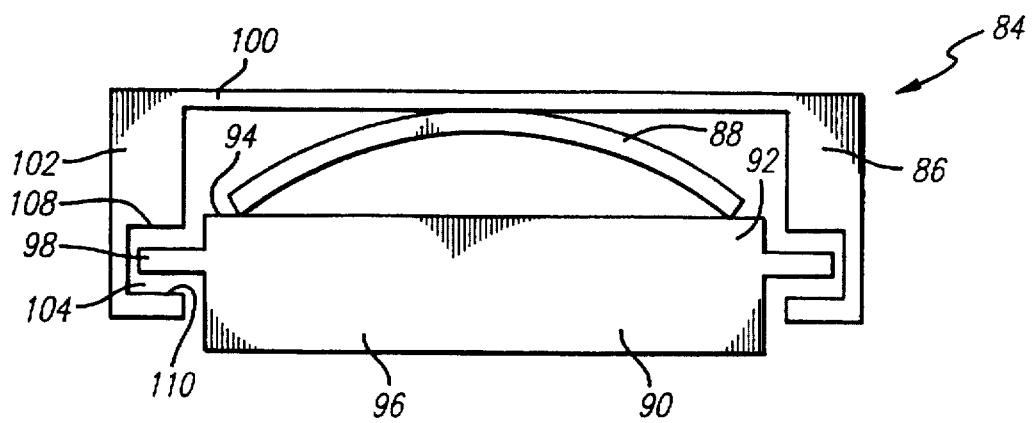

PIEZOELECTRIC VIBRATING DEVICE

FIELD OF THE INVENTION

The present invention relates generally to a vibrating device, and more particularly to a vibrating device using piezoelectric material.

BACKGROUND OF THE INVENTION

The present invention relates to devices capable of delivering a predefined mechanical vibration to its user when called upon by means of an electrical stimulus. Such devices are commonly ref erred to as shakers or vibrators and are used in applications as diverse as personal electronic pagers, personal massage aids, industrial dry goods conveyers, and vibratory feeders in the assembly of small parts such as electronic components.

More particularly, the invention addresses shaker or vibrator devices wherein the vibration is produced by a motive agent or motor employing electroactive materials. Such materials, as is well known in the art, have the desirable property of converting electrical energy into mechanical energy, by undergoing a controllable amount of deformation when subjected to an applied electric field. Examples of electroactive materials include, among others, piezoelectric ceramics such as the lead zirconate titanate family (commonly known as PZT) with all its variously substituted and doped relatives, electrostrictive ceramics such as certain compositions of lanthanum doped PZT (PLZT) or lead magnesium niobate (PMN), and piezoelectric polymers such as polyvinylidene fluoride (PVDF).

In a vibrating motor the electroactive materials may be arranged in a variety of ways including rods, sheets or plates, cylindrical or spherical shells, or multilayered benders. Benders are devices wherein the controlled strain of one or more layers is resisted by other layer or layers, resulting in a bending deformation. The most common benders are classified as unimorphs, which consist of one active layer, and bimorphs, which consist of two active layers. More recently another type of bender was introduced under the name of RAINBOW™ (Reduced and Internally Biased Oxide Wafer) and possessing certain attractive performance characteristics. The RAINBOW™ wafer is described in detail in co-pending application Ser. No. 08/021,367, entitled "Monolithic Prestressed Ceramic Devices And Method For Making Same," which is incorporated by reference herein.

Although the inventive concepts disclosed herewith have wider applicability, the discussion below will emphasize the use of benders in electronic paging devices. Most known vibrating pagers utilize motors as the vibrating device. The motor drives an eccentric mass, causing the vibratory motion. One problem with known vibrating pagers using motors is that the motor requires a significant amount of power. Another problem is that the motors are relatively large and therefore, require that the pager be larger than desired. Reducing the size of the motor, however, also reduces the strength of the vibratory motion.

Vibrating pagers using electroactive or piezoelectric material have also been described in the art, and their advantages over motor-driven eccentric weights and other electromagnetic shakers have been recognized. Although the state of the art has been advanced, practical problems such as insufficient ruggedness and inadequate mechanical vibrational output have hindered the widespread use of piezoelectric vibrators.

By way of example, U.S. Pat. No. 5,229,744 discloses a piezoelectric type pager. The pager includes a piezoelectric element having opposing ends attached to separate portions of the casing. A problem with this design is that the piezoelectric material is not well supported or protected and is subject to damage if the two portions of the casing separate.

The lack of ruggedness of the known pagers arises when a relatively delicate piezoelectric bender device is called upon to provide the only mechanical linkage between two relatively massive portions of the pager. Under these conditions, most externally applied forces or impacts will be transmitted directly to the bender, likely resulting in its premature demise.

The modest mechanical output of the known pagers stems in part from the need to limit the frequency content to the relatively inaudible range below 100 Hz. Since the magnitude of the inertial load that the vibratory motor is required to carry is proportional to the square of the frequency, the mechanical output is greatly diminished at low frequencies. In view of these limitations, the older and more established electromagnetic shaker technology is able to persist, in spite of its inconveniently large power consumption and bulkiness.

Therefore, it is desired to have a vibrating pager with a relatively small vibrating device that requires a small amount of power to operate, yet produces a desired amount of vibration.

SUMMARY OF THE INVENTION

Accordingly, it is a primary object of the present invention to overcome one or more disadvantages and limitations of the prior art. A significant object of the present invention is to provide a vibrating device for a pager that is relatively easily manufactured, requires a small amount of power to operate, and provides the desired amount of vibration.

According to a broad aspect of the present invention, a piezoelectric vibrating device includes a case having a first compartment with a first compartment height. A bender element, fabricated from an piezoelectric material, is disposed within the first compartment. A motion limiter is disposed within the case for preventing damage to the bender. The motion limiter has a first portion that abuts against the case to prevent the first compartment height from compressing beyond a predetermined first compartment minimal height. The device further includes electronic controls for providing a signal to the bender element. The electronic controls further include an optimal wave form signal generator. The wave form may also be a square wave, pulse train, truncated wave or other type of wave depending on each particular application.

A feature of the present invention is that the piezoelectric device is easily manufactured.

Another feature of the present invention is that the piezoelectric device requires less power to operate than a pager motor.

Another feature of the present invention is that the piezoelectric vibrating device provides more vibration than the pager motor.

These and other objects, advantages and features of the present invention will become readily apparent to those skilled in the art from a study of the following description of an exemplary preferred embodiment when read in conjunction with the attached drawing and appended claims.

BRIEF DESCRIPTION OF THE DRAWING

FIG. 2 is a side cross-sectional view of a second embodiment of the piezoelectric vibrating device of the present invention;

FIG. 3 is a side cross-sectional view of a third embodiment of the piezoelectric vibrating device of the present invention;

FIG. 4 is a side cross-sectional view of a fourth embodiment of the piezoelectric vibrating device of the present invention;

DESCRIPTION OF AN EXEMPLARY PREFERRED EMBODIMENT

Figure 1:
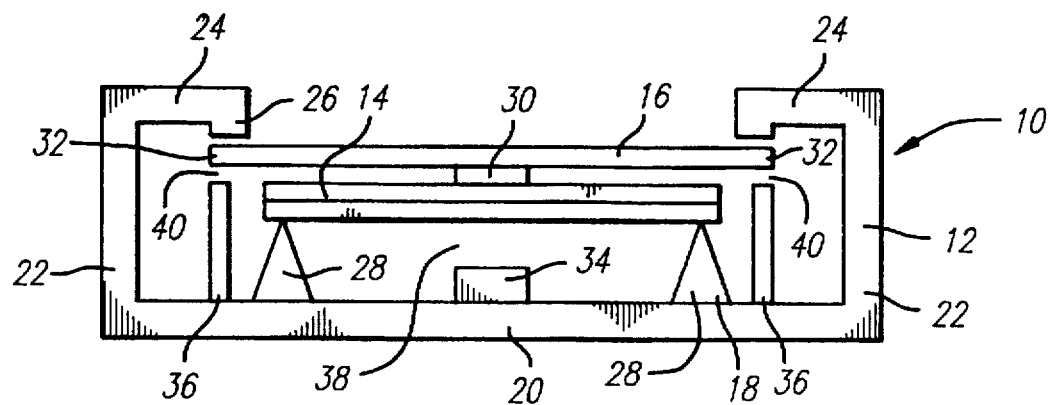
FIG. 1 is a side cross-sectional view of a first embodiment of the piezoelectric vibrating device of the present invention.

Referring now to FIG. 1, a first embodiment of the piezoelectric vibrating device 10 is shown. The vibrating device 10 comprises a case 12, a bender 14, a moving mass 16 and a support device 18. The case 12 is fabricated from a lightweight durable material, such as plastic, and includes a base portion 20, a side portion 22, an upper portion 24, and a flange portion 26. The flange portion 26 extends downward from the upper portion 24.

In the embodiment shown, the support device 18 includes two support arms 28. Each support arm 28 is mounted to the base portion 20 of the case 12. The bender 14 is mounted on the support arms 28, preferably with the support arms 28 being located at opposing ends of the bender 14. The moving mass 16 is interconnected to the bender 14 through a spacer 30. The moving mass 16 is also preferably substantially planar. Therefore, the bender 14 and moving mass 16 are preferably in a spaced apart relationship with each other.

The moving mass 16 is interconnected to the bender 14 such that the moving mass outer edges 32 are in close proximity to the flange portion 26 of the case 12.

The vibrating device 10 may further include a first motion limiter 34 and second motion limiters 36. The first motion limiter 34 is mounted to the base portion 20 of the case 12 intermediate the case 12 and the bender 14. The first motion limiter 34 has a predetermined height such that small gap 38 remains between the first motion limiter 34 and the bender 14 in its initial position. The second motion limiters 36 are mounted to the base portion 20 of the case 12 directly below the moving mass outer edges 32. The second motion limiters 36 have a predetermined height such that a small space 40 remains between the moving mass 16 in its initial position and the motion limiter 36.

During operation of the vibrating device 10 a current is applied to the bender 14, causing the bender 14 to bend and vibrate. The vibration of the bender 14, in turn causes the moving mass 16 to vibrate. When the moving mass 16 vibrates, it contacts the flange portion 26 of the case 12, imparting the vibratory energy to the case 12. The first motion limiter 34 protects the bender 14 from overextending in a downward position and from possible breakage. The second motion limiters 36 prevent the moving mass 16 from overextending in a downward position.

Figure 5:
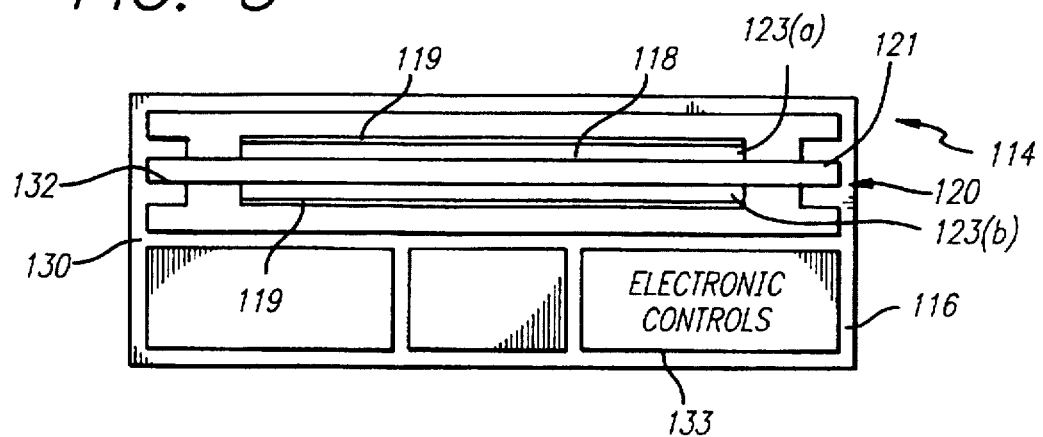
FIG. 5 is a side cross-sectional view of a fifth embodiment of the piezoelectric vibrating device of the present invention.

The bender 14 is preferably utilizes a piezoelectric wafer and may comprise several different structures. One option is a unimorph piezoelectric structure that includes a piezoelectric material wafer bonded to a stiff shim. A second alternative is a bimorph piezoelectric structure. The bimorph structure may include either two piezoelectric wafers bonded together or two piezoelectric wafers having a stiff shim bonded between the two wafers, as best shown in FIG. 5. It should be noted that the piezoelectric material wafers may be replaced by any type of electroactive material that responds to an electric field by developing a strain. A third alternative is a RAINBOW™ wafer. Additionally, another advantage of the present invention is that the piezoelectric structure is easily manufactured because the thickness of the piezoelectric material may be greater than eight mils.

Referring now to FIG. 2, a second embodiment 42 of the piezoelectric shaker is shown. This second embodiment 42 includes a case 52 and a piezoelectric element 48. The case 52 includes a first compartment 44 for containing the piezoelectric material and a second compartment 46 for containing a power supply 45 and electronics control 47. The piezoelectric material wafer used in the second embodiment is preferably preloaded for as much as 50% of the height of the wafer. The effective spring constant of the piezoelectric material wafer is reached when the edges of the piezoelectric material are displaced in a direction perpendicular to the piezoelectric wafer relative to its center. As previously described, the RAINBOW™ piezoelectric material may be used for the wafer, as well as the unimorph or bimorph piezoelectric material. The RAINBOW™ piezoelectric material wafer has a dome or arc-shaped structure that is the result of tension placed by the reduced layer of wafer and compression on the opposite side. The dome structure provides significant displacement capabilities with relatively low spring rate.

In the embodiment shown in FIG. 2, the piezoelectric element 48 is a piezoelectric wafer having electrodes 50 on opposing surfaces of the wafer. Wire leads (not shown) facilitate connection to the electronics control. As the piezoelectric element deforms, the vibrational output is transmitted to the case through momentum transfer.

Referring now to FIG. 3, a third embodiment 54 of the piezoelectric shaker is shown. In the third embodiment 54, the shaker includes a case 56, a piezoelectric element 58, a motion limiter 60, and a spring 62. The piezoelectric element 58, motion limiter 60, and spring 62 function together as a preloaded mass spring system.

More specifically, the motion limiter includes a substantially planar portion 64 having an upward extending ridge 66 and a downward extending ridge 68 along the outer circumference of the planar portion. The planar portion 64 further defines an upper surface 70 and a lower surface 72. The case 56 also defines an upper portion 74 and a lower portion 76. The piezoelectric element 58 is disposed intermediate the planar portion upper surface 70 and the upper portion 74 of the case, in a first compartment 61 of the case. The upward extending ridge 66 of the motion limiter prevents the piezoelectric element from shifting in a radial direction.

The electronic controls 78 are disposed intermediate the planar portion lower surface 72 and the lower portion 76 of the case in a second compartment 63 of the case. The spring 62 is also disposed intermediate the planar portion lower surface 72 and the case lower portion 76. The spring 62 may include a plurality of springs as required by each particular shaker application.

The piezoelectric vibrational output in the present invention is transmitted to the case by means of momentum transfer. Momentum transfer may be accomplished by impact. membrane vibrational transfer or a mass-spring vibration mechanism. With the use of a mass-spring vibration mechanism, tuning the natural frequency of the mass-spring system to the resonance of the vibrational structure can achieve maximum vibrational transmissibility.

The upward extending ridge 66 of the motion limiter 60 has a first height 80. The downward extending ridge 68 of the motion limiter has a second height 82. The first height 80 is determined such that the upward extending ridge 66 contacts the upper portion 74 of the case before the planar portion 64 of the motion limiter approaches too close to the upper portion 74 of the case. Therefore, the piezoelectric material cannot be crushed between the planar portion 64 and the upper portion 74 of the case. In other words, the first height 80 of the upward extending ridge 66 of the motion limiter 60 is greater than a predetermined minimum desired height of the first compartment 61.

Similarly, the second height 82 of the downward extending ridge 68 is such that the ridge 68 contacts the lower portion 76 of the case before the planar portion lower surface 72 and the case lower portion 76 approach too near to each other. Therefore, the electronic controls are not crushed between the motion limiter 60 and the case lower portion 76. In other words, the second height 82 of the downward extending ridge 68 of the motion limiter 60 is greater than a predetermined minimum desired height of the second compartment 63.

Referring now to FIG. 4, a fourth embodiment 84 of the piezoelectric shaker of the present invention is shown. This embodiment 84 includes a case 86, a piezoelectric element 88, and a motion limiter 90. The case 86 is elastically supported by the piezoelectric element 88. The motion limiter 90 includes a central preferably disc-shaped base portion 92 having an upper surface 94 and a lower surface 96. The motion limiter 90 further includes a lip 98 extending radially from the central portion 92. The case 86 includes an upper portion 100 and a side wall 102. The side wall 102 includes an indentation 104 corresponding to the radially extending lip 98 of the motion limiter. The indentation 104 has a pre-determined height 106 between an upper end 108 and a lower end 110 of the indentation and is located at a predetermined distance 112 from the case upper portion 100. The radially extending lip 98 therefore contacts the upper end 108 of the indentation before the case upper portion 100 and the motion limiter upper surface 94 approach too closely. As a result, the piezoelectric element 88 can not be crushed between the motion limiter 90 and the case 86.

Referring now to FIG. 5, a fifth embodiment 114 of the piezoelectric shaker of the present invention is shown. This embodiment includes a case 116, a piezoelectric element 118, and motion limiting mechanism 120. The case 116 includes a first compartment 122 and a second compartment 124. The first compartment 122 defines an upper surface 126 and a lower surface 128. The first compartment 122 further includes side walls 130 having an indentation 132. The piezoelectric element 118 is located in the first compartment 122 and the electronic controls 133 are located in the second compartment 124.

The piezoelectric element 118 shown in FIG. 5 is a bimorph structure and includes two piezoelectric wafers 123(a), 123(b) with a shim 121 bonded intermediate the two wafers. Two electrodes 119 are disposed on opposing surfaces of the piezoelectric element. The shim 121 has an outer circumference that fits within the indentation 132. Therefore, the shim 121 functions as a diaphragm for transmitting vibrational power to the case 116. As a result, the indentation 132 prevents the piezoelectric element 118 from excessive movement in an upward or downward direction. Leads (not shown) connect the electrodes 119 and the shim 121 with the electronics controls 133.

Figure 6:
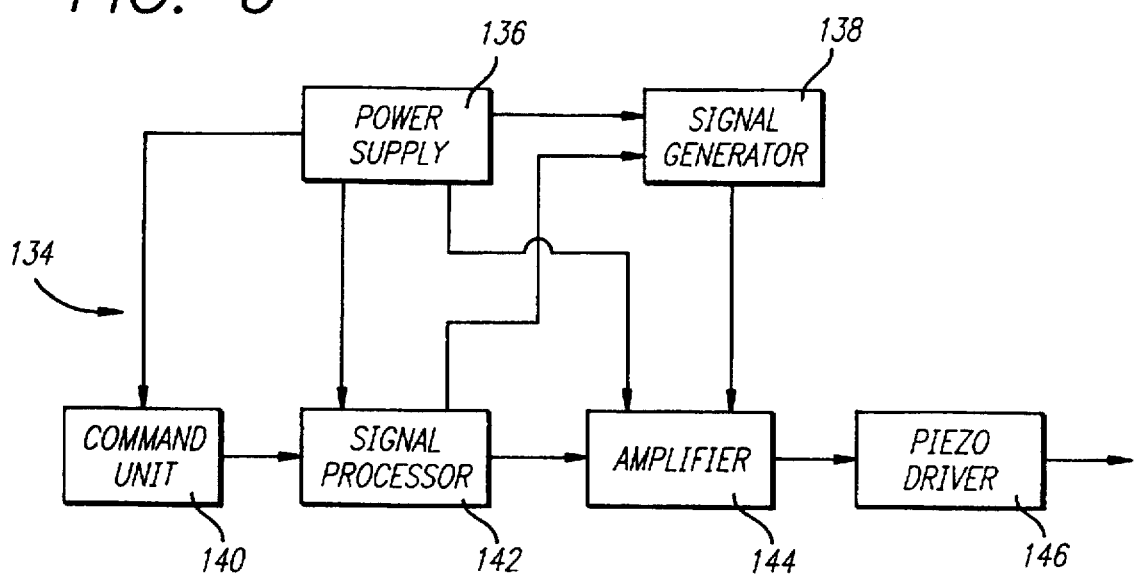
FIG. 6 is a block diagram of the control circuitry for the vibrating device of the present invention.

Referring now to FIG. 6, the electronic control circuitry 134 for the piezoelectric shaker is shown. The circuitry includes a power supply 136, a signal generator 138, a command unit 140, a signal processor 142, an amplifier 144, and the piezodriver 146. The power supply 136 may be a battery or an AC/DC converter and provides power to the signal generator 138, the command unit 140, the signal processor 142 and the amplifier 144. The command unit 140 may comprise either a radio receiver or a push button, and provides a command signal to the signal processor 142. The signal processor 142, in turn, provides a processed signal to the signal generator 138 and the amplifier 144. The signal generator 138 is preferably a function generator and provides a function signal to the amplifier 144. The amplifier 144 provides an amplified signal to the piezodriver 146, which provides the vibrational output.

Figure 7A:
FIG. 7 is a diagram showing alternative command signals for the piezoelectric vibrating device of the present invention.
Figure 7B:
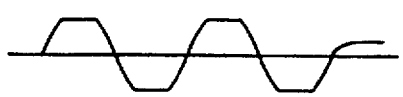
Figure 7C:
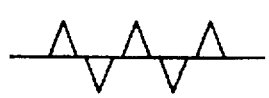

Referring now to FIG. 7, alternative function signals are shown. The first signal is a square wave 148, the second a truncated wave 150 and the third a pulse train signal 152. The alternative wave form signals are used depending on the properties of the material used in the piezoelectric element and the amount of vibration desired. Different shapes, masses and stiffnesses of the piezoelectric material may require different waveforms. For example, the mechanical vibrational power output achieved with an optimal square wave may be three to four times higher than with a pure sine wave. An optimized waveform will circumvent the limitations of using sine waves as the signal.

Figure 8:
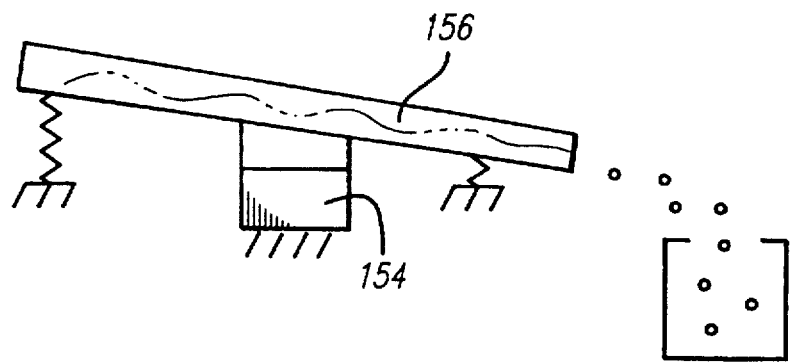
FIG. 8 is a diagram demonstrating an alternative use of the piezoelectric vibrating device.

It should be noted that the shaker embodiments shown may be utilized for other applications other than pagers. By way of example, as shown in FIG. 8, the shaker may be used in industry in connection with a parts or material feeder. The shaker 154 may be attached to a feeder 156 such that the vibratory motion of the shaker causes parts or material to be released from the feeder.

There has been described hereinabove an exemplary preferred embodiment of the piezoelectric shaker according to the principles of the present invention. Those skilled in the art may now make numerous uses of, and departures from, the above-described embodiments without departing from the inventive concepts disclosed herein. Accordingly, the present invention is to be defined solely by the scope of the following claims.

I claim as my invention:

1. A piezoelectric vibrating device comprising:

a case having a first compartment and a second compartment, said first compartment defining a vertical axis and having a first compartment height along said vertical axis, said second compartment having a second compartment height;

a bender element fabricated from an electroactive material, said bender element disposed within said first compartment and further wherein at least a portion of said bender element being axially moveable within said first compartment; and a motion limiter disposed within said case for preventing damage to said bender element, said motion limiter having a first portion that abuts against said case to prevent said first compartment height from axially compressing beyond a predetermined first compartment minimal height, said motion limiter further having a second portion that abuts against said case to prevent said second compartment height from compressing beyond a predetermined second compartment minimal height.

2. A piezoelectric vibrating device comprising:

a case having a first compartment, said first compartment defining a vertical axis and having a first compartment height along said vertical axis;

a bender element fabricated from an electroactive material, said bender element disposed within said first compartment and further wherein at least a portion of said bender element being axially moveable within said first compartment;

a motion limiter disposed within said case for preventing damage to said bender element, said motion limiter having a first portion that abuts against said case to prevent said first compartment height from axially compressing beyond a predetermined first compartment minimal height; and a spring disposed intermediate said motion limiter and said case.

* * * * *